United States Patent
Sato

(10) Patent No.: US 8,278,616 B2
(45) Date of Patent: Oct. 2, 2012

(54) POSITION DETECTOR AND EXPOSURE APPARATUS

(75) Inventor: Mitsuya Sato, Yokohama (JP)

(73) Assignee: Canon Kabushiki Kaisha (JP)

( * ) Notice: Subject to any disclaimer, the term of this patent is extended or adjusted under 35 U.S.C. 154(b) by 405 days.

(21) Appl. No.: 12/716,368

(22) Filed: Mar. 3, 2010

(65) Prior Publication Data
US 2010/0227263 A1 Sep. 9, 2010

(30) Foreign Application Priority Data
Mar. 3, 2009 (JP) ................. 2009-048819

(51) Int. Cl.
*G03B 27/58* (2006.01)
(52) U.S. Cl. ......... 250/231.13; 250/231.18; 250/559.29; 355/53; 355/72; 356/616
(58) Field of Classification Search ............. 250/559.29, 250/559.3, 231.13, 231.14, 231.18; 356/399, 356/614, 616, 617; 355/53, 72, 75
See application file for complete search history.

(56) References Cited

U.S. PATENT DOCUMENTS

| 5,610,715 | A | 3/1997 | Yoshii et al. | |
|---|---|---|---|---|
| 7,602,489 | B2 | 10/2009 | Van Der Pasch et al. | |
| 8,134,688 | B2 * | 3/2012 | Shibazaki | ....... 355/68 |

FOREIGN PATENT DOCUMENTS

| JP | 7-270122 A | 10/1995 |
|---|---|---|
| JP | 2007-266581 A | 10/2007 |

* cited by examiner

*Primary Examiner* — Kevin Pyo
(74) *Attorney, Agent, or Firm* — Rossi, Kimms & McDowell LLP

(57) ABSTRACT

A position detector includes a first planar encoder including a first encoder head unit mounted on a test object that is a movable member, and a first grating unit mounted on a fixed member, the first planar encoder being configured to detect a position of the test object in two directions by measuring a position of the first grating unit using the first encoder head unit, and a second planar encoder including a second encoder head unit mounted on the fixed member, and a second grating unit mounted on the movable member, the second planar encoder being used to generate data for calibrating the position of the first grating unit measured by the first encoder head unit.

10 Claims, 16 Drawing Sheets

A position detector according to one aspect of the present invention includes a first planar encoder including a first encoder head unit mounted on a test object that is a movable member, and a first grating unit mounted on a fixed member, the first planar encoder being configured to detect a position of the test object in two directions by measuring a position of the first grating unit using the first encoder head unit, and a second planar encoder including a second encoder head unit mounted on the fixed member, and a second grating unit mounted on the movable member, the second planar encoder being used to generate data for calibrating the position of the first grating unit measured by the first encoder head unit.

POSITION DETECTOR AND EXPOSURE APPARATUS

BACKGROUND OF THE INVENTION

1. Field of the Invention

The present invention relates to a position detector and an exposure apparatus.

2. Description of the Related Art

A position detector for an exposure apparatus is known and uses a planer encoder that includes a scale (grating) and an encoder head to detect a position of a substrate stage configured to support and drive a substrate (Japanese Patent Laid-Open Nos. ("JPs") 7-270122 and 2007-266581). One of the scale and the encoder head is fixed onto the substrate stage as a movable member and the other is fixed onto a fixed member. The encoder head usually includes a light source, a grating, and an optical sensor. Light from the light source is deflected by the grating in the encoder head, and reflected and deflected by the scale, and forms an interference pattern on the optical sensor. A position of the substrate stage is detectable by measuring the interference pattern.

The position detector of JP 7-270122 measures the scale by changing a plurality of encoders, and has a problem in that errors accumulate at the switching time. The position detector of JP 2007-266581 has a problem in that the detection precision lowers without calibrations because of the low manufacture precision and low installation precision of the scale. In addition, a quick calibration method is not proposed and the detection needs a long time. Moreover, the detection precision is low because of the low alignment precision between the grating in the encoder head and the substrate stage.

SUMMARY OF THE INVENTION

The present invention provides a highly precise and quickly detecting position detector and an exposure apparatus having the same.

Further features of the present invention will become apparent from the following description of exemplary embodiments with reference to the attached drawings.

DESCRIPTION OF THE EMBODIMENTS

Figure 1:
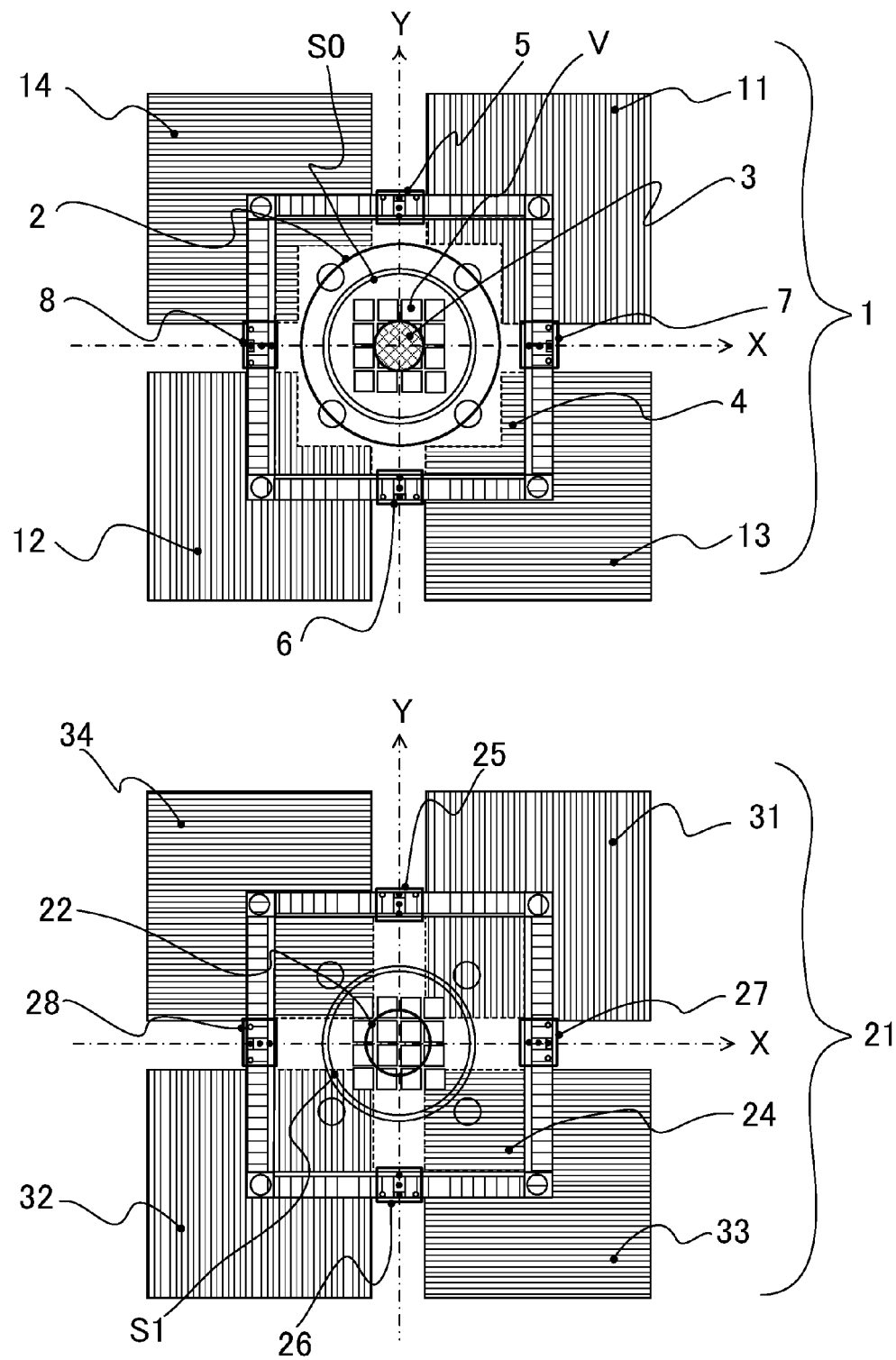
FIG. 1 is a partially transparent plane view of an exposure apparatus.

FIG. 1 is a partially transparent plane view of an exposure apparatus. The exposure apparatus is a twin stage type exposure apparatus that includes an exposure unit 1 and a measurement unit 21.

Each of the exposure unit 1 and the measurement unit 21 is mounted with a substrate. A substrate S1 mounted on the measurement unit 21 is a substrate to be next exposed by the exposure unit 1, and a substrate S0 mounted on the exposure unit 1 is a measured substrate that has been just previously measured by the measurement unit 21. The exposure apparatus 1 and the measurement unit 21 operate simultaneously and in parallel. In other words, the exposure unit 1 is exposing the substrate S0 while the measurement unit 21 is measuring the substrate S1.

The substrate is a wafer in this embodiment, and a liquid crystal substrate in another embodiment. A photoresist is applied onto a surface of the substrate. A pattern is exposed onto the substrate, and a plurality of areas ("shots" hereinafter) V, each of which is an object of one exposure, are formed on the substrate in a matrix shape.

The exposure unit 1 is a scanning exposure apparatus configured to expose a pattern of an original (mask or reticle) onto the substrate in a step-and-scan method. The exposure unit 1 includes a light source (not shown), an illumination optical system (not shown), an original stage (not shown), a projection optical system 2, a (first) substrate stage, and a (first) position detector.

In the exposure unit 1 at the top side of FIG. 1, a direction that passes an intersection of a pair of one alternate long and short dash lines and is perpendicular to the paper plane is an optical axis direction (Z-axis direction) of the projection optical system 2. A Y-axis direction is a scanning direction orthogonal to the Z-axis direction. The X-axis direction is a direction orthogonal to both the optical axis direction and the scanning direction.

The light source emits a light flux used to illuminate the original or a light flux (exposure light) used for exposure, and can use a laser or a mercury lamp. The illumination optical system uniformly illuminates the original using the light flux from the light source via an exposure slit. The original has a pattern to be transferred onto the substrate, and is supported and driven by the original stage. The original stage can drive the original in and around each of the XYZ axes.

The projection optical system 2 projects an image of an original pattern onto a substrate, and maintains an optically conjugate relationship between the original and the substrate. This embodiment configures an immersion exposure apparatus that fills a liquid having a refractive index higher than that of air in a space between the substrate and a final surface of an optical element closest to the substrate of the projection optical system. A reference numeral 3 denotes an immersion area that is an exposure area that receives immersion exposure. However, the present invention does not particularly limit the medium between the projection optical system 2 and the substrate.

The substrate stage is configured to support the substrate S0 and to drive the substrate S0 in and around each of the XYZ axes. The substrate stage includes a fine movement movable member 4 configured to provide a fine movement of the substrate S0. The substrate S0 is fixed onto the substrate stage via a substrate chuck 41 (not shown in FIG. 1). The substrate stage of the exposure unit 1 and the substrate stage of the measurement unit 21 have similar structures.

The position detector includes a first planar encoder and a second planar encoder, configured to detect a position of a substrate stage (test object) that is a movable member in two directions (XY directions). In other words, the position detector of this embodiment adds the second planar encoder to the position detector having the first planar encoder.

The position detector includes a movable member fixed onto the fine movement movable member 4 of the substrate stage and configured to move with the substrate stage, and a fixed member mounted on a fixed member that is stationary (relative to the substrate stage) around a barrel of the projection optical system 2. The fixed member may be a barrel of the projection optical system 2 or may be a frame, a base, a chamber, or the like (not shown) of the exposure apparatus.

Figure 2:
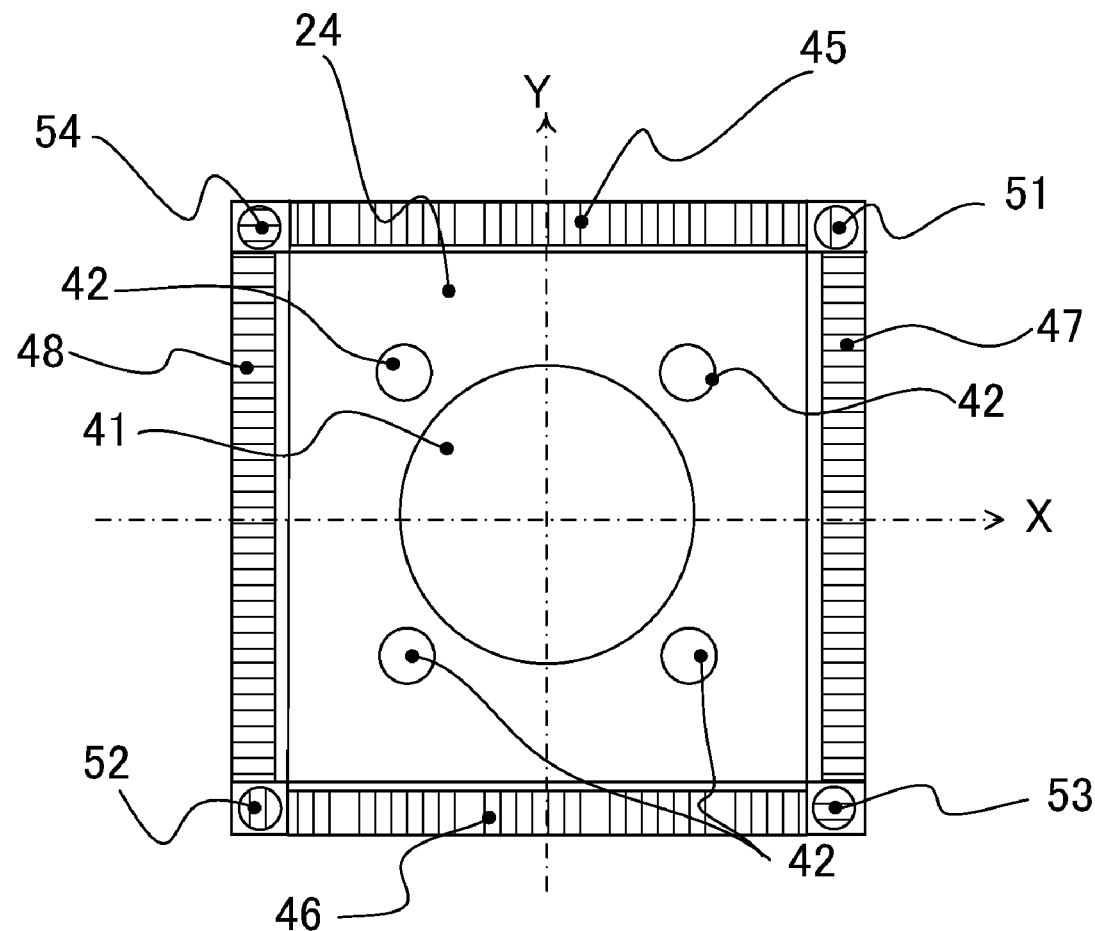
FIG. 2 is a transparent plane view of a fine movement movable member of a substrate stage shown in FIG. 1.

FIG. 2 is a transparent plane view of the fine movement movable member 24 of the measurement unit 21, but the fine movement movable member 4 of the exposure unit 1 is configured similarly to the fine movement movable member 24. A substrate chuck 41 is fixed at the center of the fine movement movable member 24. Four original mark sensors 42 are provided around the substrate chuck 41 and configured to detect original reference marks projected by the projection optical system 2. The fine movement movable member 24 further includes a movable member of the position detector, as shown in FIG. 2.

The movable member of the projection detector includes, as shown in FIG. 2, X scales (or X gratings), 45 and 46, Y scales (or Y gratings) 47 and 48, X encoder heads 51 and 52, and Y encoder heads 53 and 54. The X scales 45 and 46 and the Y scales 47 and 48 form four sides of a hollow square, and the X encoder heads 51 and 52 and the Y encoder heads 53 and 54 are arranged at four corners of the square.

The first planar encoder includes a first encoder head unit mounted on the movable member, and a first grating unit mounted on the fixed member. On the other hand, the second planar encoder includes a second encoder head unit mounted on the fixed member, and the second grating unit mounted on the movable member. The first planar encoder detects the position of the substrate stage in the two directions by measuring the position of the first grating unit using the first encoder head unit. The second planar encoder is used to generate data for calibrating the position of the first grating unit measured by the first encoder head unit.

In FIG. 2, the first encoder head unit includes the X encoder heads 51 and 52 for measurements of the X-axis direction, and the Y encoder heads 53 and 54 for measurements of the Y-axis direction. The second grating unit includes the X scales 45 and 46 used to mainly measure the X-axis direction, and the Y scales 47 and 48 used to mainly measure the Y-axis direction.

The X (linear) scale 45 is a narrow member that extends in parallel to the X-axis direction and is used to measure a position of the fine movement movable member 4 or 24 in the X-axis direction with the X detection head unit 5 or 25. The X (linear) scale 46 is a narrow member that extends in parallel to the X-axis direction and is used to measure a position of the fine movement movable member 4 or 24 in the X-axis direction with the X detection head unit 6 or 26. Each of the X scales 45 and 46 is provided with a grating (X scale member) for measurements of the X-axis direction, a grating (Y scale member) for measurements of the Y-axis direction, and an origin scale used to measure the origin in the X-axis direction.

The Y (linear) scale 47 is a narrow member that extends in parallel to the Y-axis direction and is used to measure a position of the fine movement movable member 4 or 24 in the Y-axis direction with the Y detection head unit 7 or 27. The Y (linear) scale 48 is a narrow member that extends in parallel to the X-axis direction and is used to measure a position of the fine movement movable member 4 or 24 in the Y-axis direction with the X detection head unit 8 or 28. Each of the Y scales 47 and 48 is provided with a grating (Y scale member) for measurements of the Y-axis direction, a grating (X scale member) for measurements of the X-axis direction, and an origin scale used to measure the origin in the Y-axis direction.

The X encoder head 51 measures a position of the fine movement movable member 4 or 24 in the X-axis direction relative to the grating 11 or 31. The X encoder head 52 measures a position of the fine movement movable member 4 or 24 in the X-axis direction relative to the grating 12 or 32. These X encoder heads 51 and 52 are provided diagonally with respect to the Z axis.

The Y encoder head 53 measures a position of the fine movement movable member 4 or 24 in the Y-axis direction relative to the grating 13 or 33. The Y encoder head 54 measures a position of the fine movement movable member 4 or 24 in the Y-axis direction relative to the grating 14 or 34. These Y encoder heads 53 and 54 are provided diagonally with respect to the Z axis.

Figure 3:
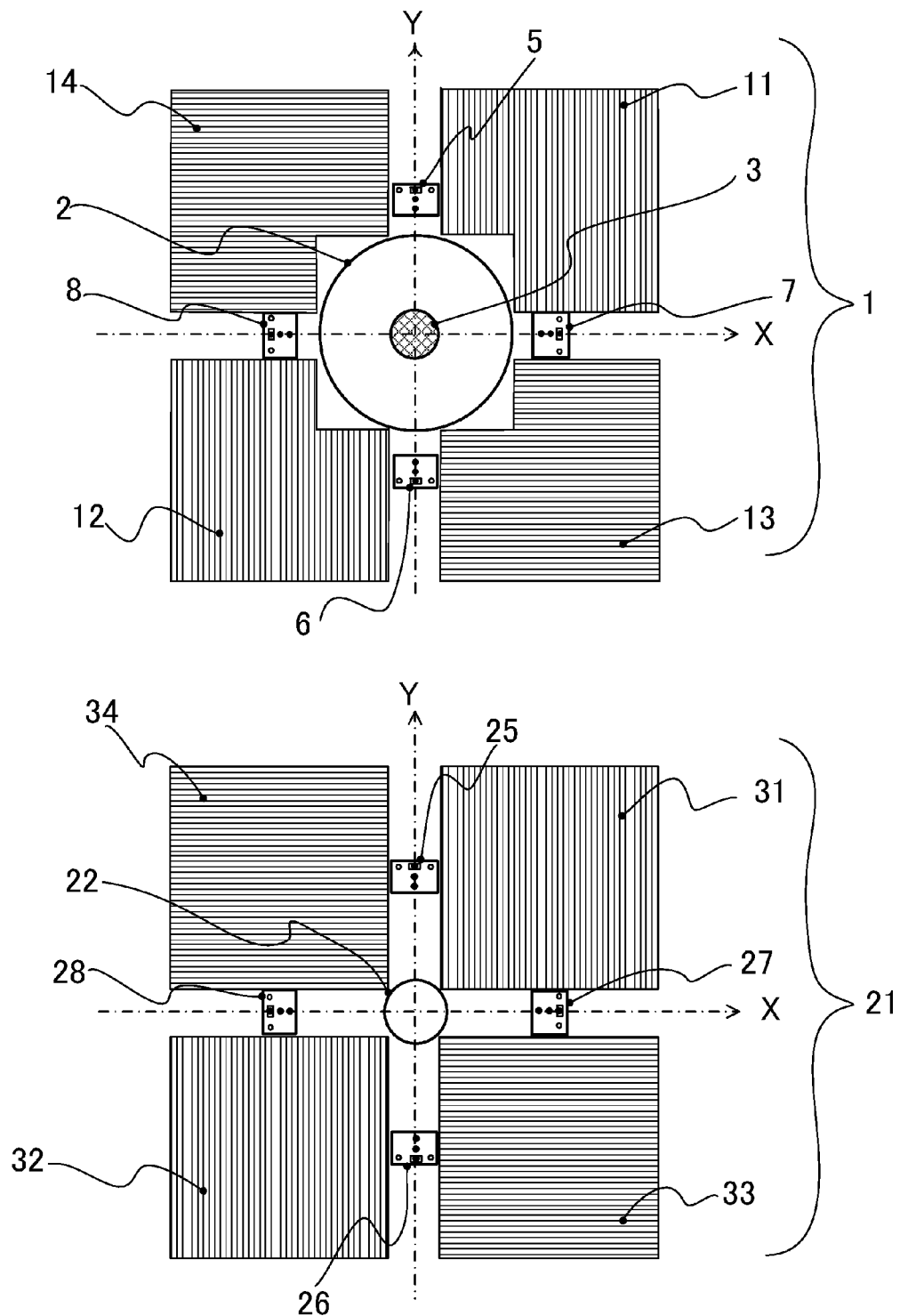
FIG. 3 is a plane view around a fixed member of a position detector shown in FIG. 1.

FIG. 3 is a plane view around the fixed member of the position detector. The fixed member of the position detector of the exposure unit 1 includes X detection head units 5 and 6, Y detection head unit 7 and 8, and grating (or grating plates) 11 to 14.

The X detection head units 5 and 6 and the Y detection head units 7 and 8 are fixed around the barrel of the projection optical system 2 and above the fine movement movable member 4. The X detection head unit 5 measures the X scale 45, and the X detection head unit 6 measures the X scale 46. The Y detection head unit 7 measures the Y scale 47, and the Y detection head unit 8 measures the Y scale 48.

The gratings 11 and 12 are arranged diagonally with respect to the optical axis of the projection optical system 2 while their grating surfaces face down (or the X encoder heads 51 and 52) and have patterns extending in parallel to the Y-axis direction. The gratings 13 and 14 are arranged diagonally with respect to the optical axis of the projection optical system 2, while their grating surfaces face down (or the Y encoder heads 53 and 54) and have patterns extending in parallel to the X-axis direction.

The X encoder heads 51 and 52 and the Y encoder heads 53 and 54 have gratings each having a pattern extending in parallel to a corresponding one of the gratings 11-14 (FIG. 2).

The measurement unit 21 is configured to obtain alignment information and focus information of the substrate, and includes an alignment detection system, a focus detection system, a (second) substrate stage, and a (second) position detector. The measurement unit 21 includes a microscope (OA scope) 22. In the measurement unit 21 shown at the bottom side of FIG. 1, a direction that passes an intersection between a pair of one alternate long and short dash lines and is perpendicular to the paper plane is an optical axis direction of the microscope 22.

The alignment detection system detects alignment marks on the substrate utilizing a microscope 22 and a so-called global alignment method. From the detection result of the position detector and the measurement result of the alignment mark of the microscope 22, arrangement information of the shots formed on the substrate can be obtained. The focus detection system utilizes an oblique light projection optical system (not shown) above the substrate, and detects the surface position (height and inclination) of the substrate before the substrate is exposed.

The X detection head units 25 and 26 correspond to the X detection head units 5 and 6, and the Y detection head units 27 and 28 correspond to the Y detection head units 7 and 8. The gratings 31 to 34 have structures corresponding to the grating 11 to 14. In the measurement unit 21, the fixed member of the position detector is provided around the barrel of the microscope 22.

Thus, in FIG. 3, the first grating unit includes the gratings 11-14 and 31-34. The second encoder head unit includes the X detection head units 5, 6, 25, and 26 configured to mainly detect the X-axis direction, and the Y detection head units 7, 8, 27, and 28 configured to mainly detect the Y-axis direction.

Figure 4:
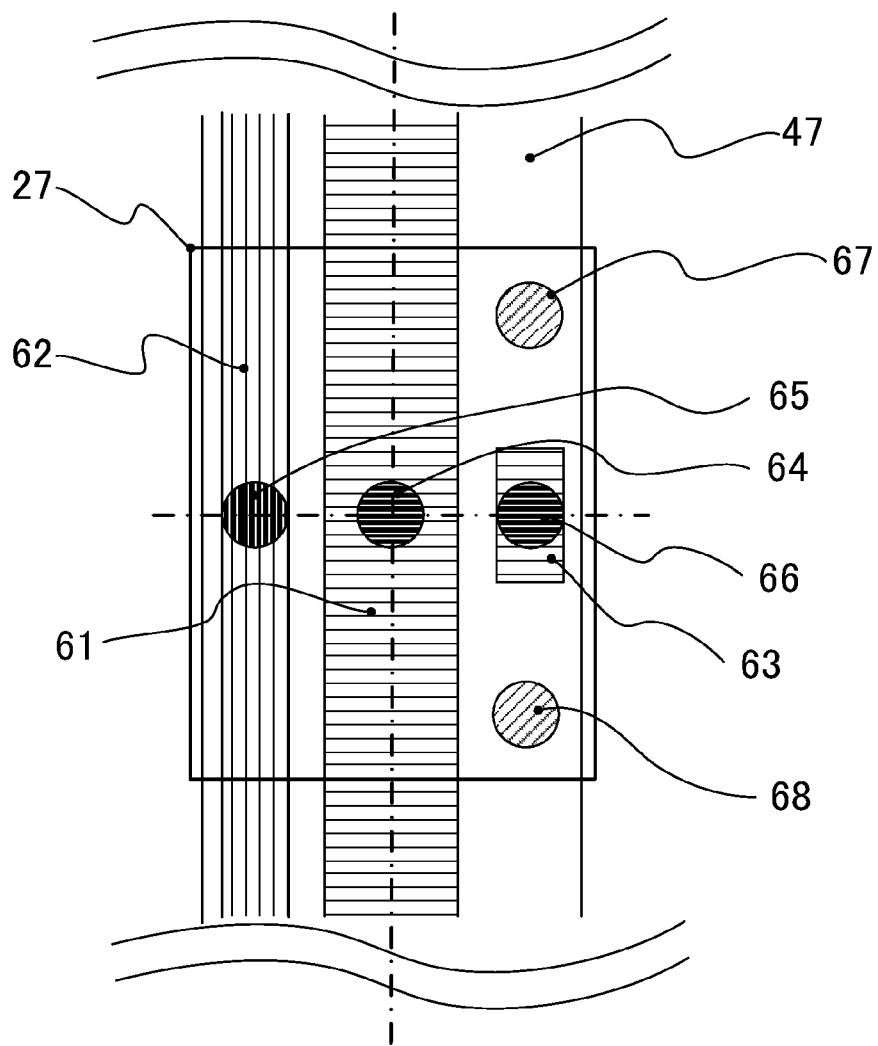
FIG. 4 is a partially enlarged transparent plane view of FIG. 1.

FIG. 4 is a partially enlarged transparent plane view showing details of the Y detection head unit 27 and the Y scale 47. The Y detection head unit 27 is provided with a Y encoder head 64, an X encoder head 65, an origin detection head 66, and fiber sensor type gap sensors 67 and 68 configured to measure a surface height position of the Y scale 47. On the other hand, the Y scale 47 is provided with a Y scale member 61, an X scale member 62, and an origin scale 63. The X scale member 62 and the Y scale member 61 constitute a pair of scale members corresponding to the two directions (XY directions). The X encoder head 65 and the Y encoder head 64 constitute a pair of encoder heads configured to detect the pair of scale members. This embodiment utilizes the pair of encoder heads 64 and 65 and the origin detection head 66 to detect the origin.

The X detection head unit 26, the Y detection head unit 28, and the X detection head unit 25 have structures that are made by rotating the Y detection head unit 27 by 90°, 180°, and 270°, respectively. Similarly, the X scale 46, the Y scale 48, and the X scale 45 have structures that are made by rotating the Y scale 47 by 90°, 180°, and 270°, respectively. Moreover, the exposure unit 1 has a similar structure.

Figure 5A:
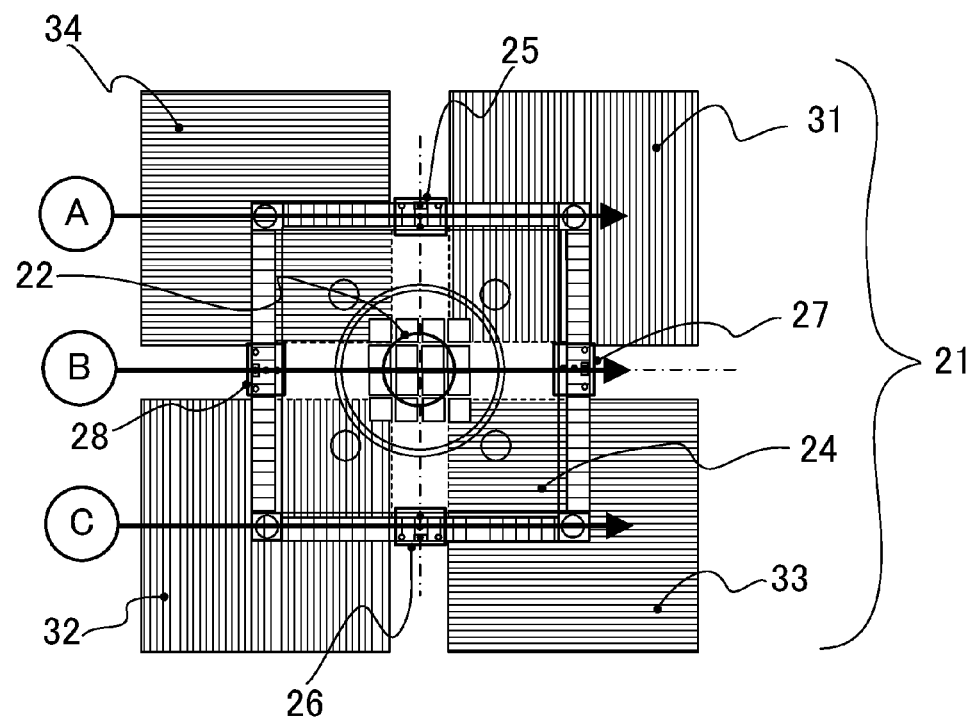
FIG. 5A is a transparent plane view of a measurement unit shown in FIG. 1.
Figure 5B:
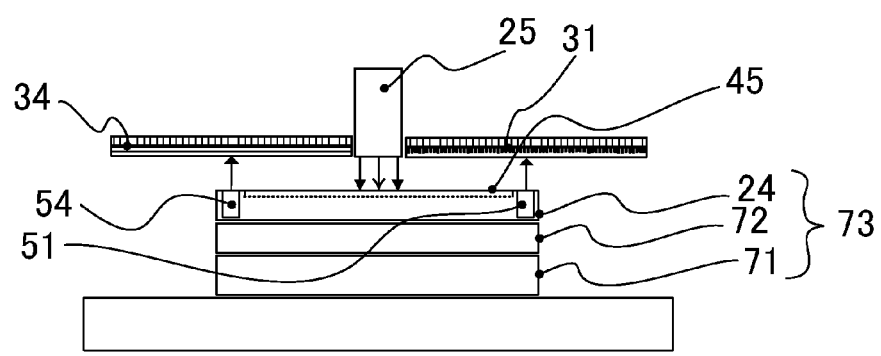
FIG. 5B shows an A section of FIG. 5A.
Figure 5C:
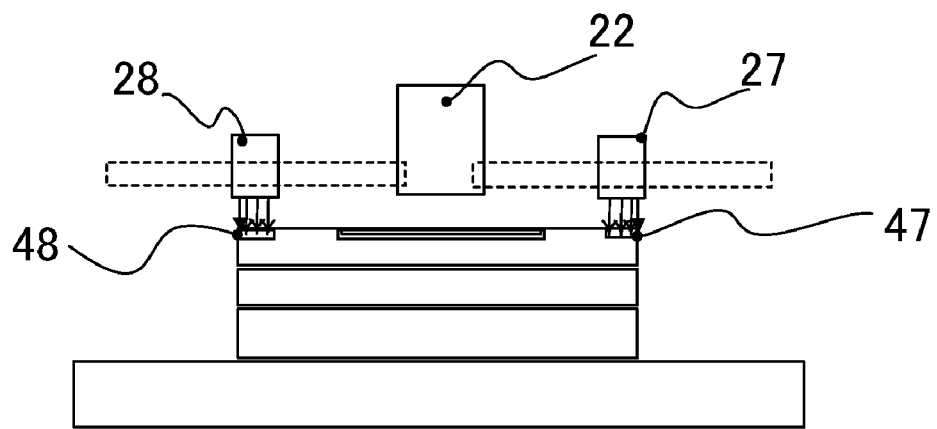
FIG. 5C shows a B section of FIG. 5A.
Figure 5D:
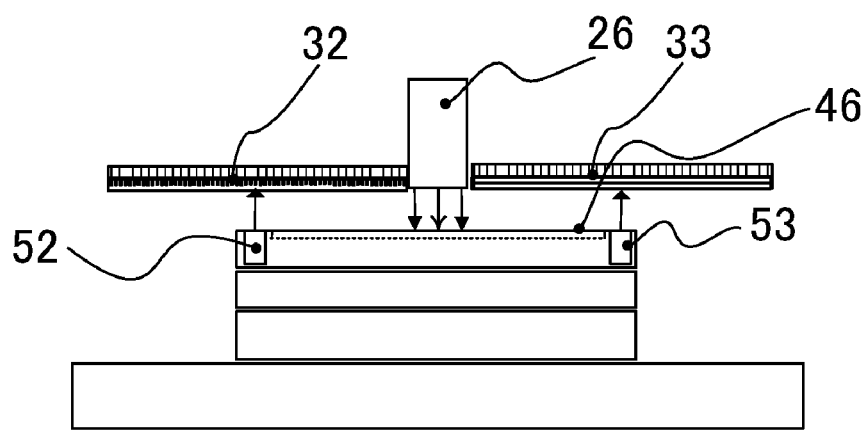
FIG. 5D shows a C section of FIG. 5A.

FIG. 5A is a transparent plane view of the measurement unit 21 shown in FIG. 1. FIGS. 5B, 5C, and 5D are sectional views taken along a line A, a line B, and a line C in FIG. 5A.

The substrate stage of the measurement unit 21 includes a stage movable member 73 provided on a base (or guide member). The stage movable member 73 includes, in order from the bottom, a rough movement movable member 71, a fine movement driver 72, and a fine movement movable member 24 driven by the fine movement driver 72. The rough movement movable member 71 uses a planar pulsed motor, and can move with precision of about 10μ even when the measurement by the encoder is unavailable.

As shown in FIGS. 5B and 5D, the X scale 45 is arranged under the X detection head unit 25 and the X scale 46 is arranged under the X detection head unit 26. The fine movement movable member 24 is moved in the X-axis direction while the X detection head units 25 and 26 fixed onto the barrel of the microscope 22 measure positions of the X scales 45 and 46 attached to the fine movement movable member 24. Thereby, the X encoder heads 51 and 52 and the Y encoder heads 53 and 54 can simultaneously measure the positions of the gratings 31 to 34.

Figure 6:
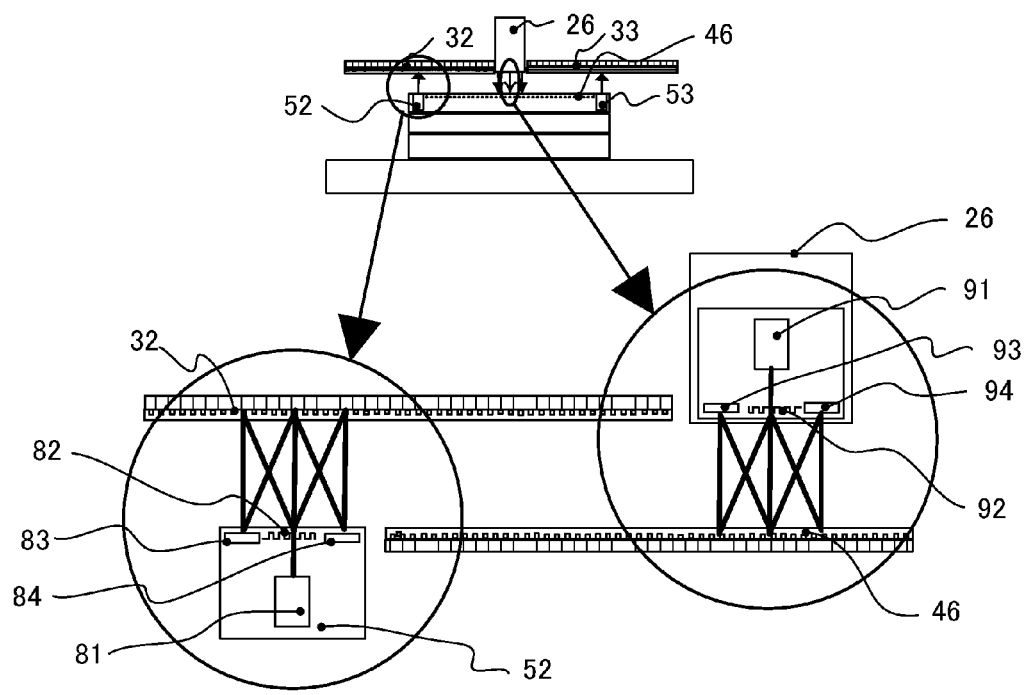
FIG. 6 is a partially enlarged sectional view of FIG. 5D.

FIG. 6 is a partially enlarged sectional view of FIG. 5D.

The X encoder head 52 includes a semiconductor laser 81 as a light source of the encoder, a grating 82, and photodetectors 83 and 84. The light beam emitted from the semiconductor laser 81 is turned into 0-th light and $\pm 1^{st}$ diffracted lights by the grating 82 and diffracted by the grating 32, and then forms an interference pattern on the photodetectors 83 and 84 (in a direction perpendicular to the paper plane). In order to detect a movement of the interference pattern, a comb-shaped three-phase photodetector (not shown) is provided on the photodetectors 83 and 84 in the same direction as the interference pattern. A three-phase analogue output signal from the three-phase photodetector is interpolated for a measurement with precision of about 1/4,000 as large as the grating period of several micrometers. Since the interference patterns on the photodetectors 83 and 84 are moved not only by the movement of the grating in the X-axis direction but also by its movement in the Z-axis direction, measurements both in the X-axis direction and in the Z-axis direction are available from the outputs of the photodetectors 83 and 84. This structure is also applied to each of the X encoder head 51, and the Y encoder heads 53 and 54.

Each of the X encoder head, the Y encoder head, the origin detection head provided to the X detection head unit 26 includes the semiconductor laser 91, the grating 92, and the photodetectors 93 and 94, and is configured similarly to the X encoder head 52. This structure is also true of each of the X detection head units 5, 6, and 25, and the Y detection head units 7, 8, 27, and 28.

Figure 7:
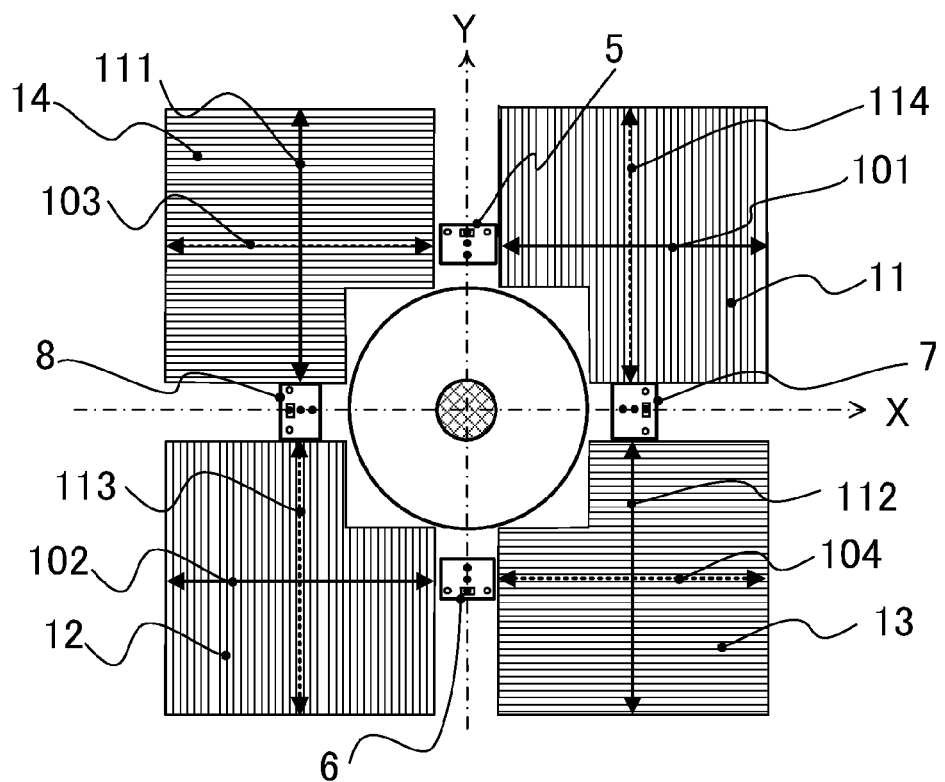
FIG. 7 is a plane view for explaining a measurement of a grating shown in FIG. 3.
Figure 7:
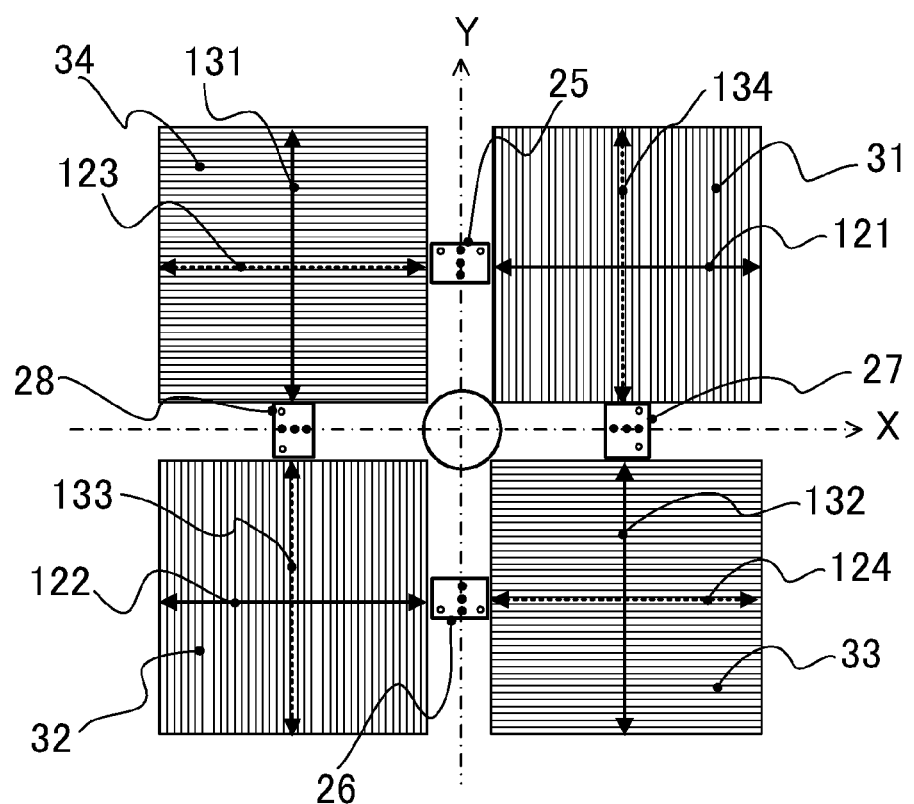

FIG. 7 is a plane view for explaining the measurements of the gratings 11-14 and 31-34.

At the measurement position, the X scales 45 and 46 are arranged under the X detection head units 25 and 26, and the gap sensors in the X detection head units 25 and 26 maintain the inclination and the height in the Z-axis direction orthogonal to the two directions (XY directions). In this state, the fine movement movable member 24 is driven in one of the two directions or the X direction. Thereby, the height information and scale error in the X direction can be measured at positions shown by arrows 121 and 122 using the X scale members of the X scales 45 and 46 and the scale surface as a height reference. Simultaneously, the height information (calibration data) and the scale error (rotation) in the Y-axis direction of the gratings 34 and 33 can be measured at positions shown by arrows 123 and 124 using the Y scale members of the X scales 45 and 46 and the scale surface as a height reference.

Similarly, at the measurement position, the Y scales 47 and 48 are arranged under the Y detection head units 27 and 28, and the gap sensors in the Y detection head units 27 and 28 maintain the inclination and the height in the Z-axis direction orthogonal to the two directions (XY directions). In this state, the fine movement movable member 24 is driven in the other of the two directions or the Y direction. Thereby, the height information and scale error in the Y direction of the gratings 34 and 33 can be measured at positions shown by arrows 131 and 132 using the Y scale members of the Y scales 48 and 47 and the scale surface as a height reference. Simultaneously, the height information (calibration data) and the scale error (rotation) in the X-axis direction of the gratings 32 and 31 can be measured at positions shown by arrows 133 and 134 using the X scale members of the Y scales 48 and 47 and the scale surface as a height reference.

Similar measurements are performed for the gratings 11 to 14. Thus, the calibration data contains information of at least one of a magnification, a rotation, and a height of each of the gratings 11-14, and 31-34.

FIGS. 8A-8D are plane views showing an import of the substrate S1 into the fine movement movable member 24. A reference numeral 202 denotes a transport hand configured to mount the substrate S1 that has already undergone the pre-alignment by a transport system (not shown), onto the fine movement movable member 24 from the transport system. A reference numeral 203 denotes a PA microscope that can be driven in the X-axis direction, and receives an image of a surface pattern of the substrate mounted on the transport hand 202.

Figure 8A:
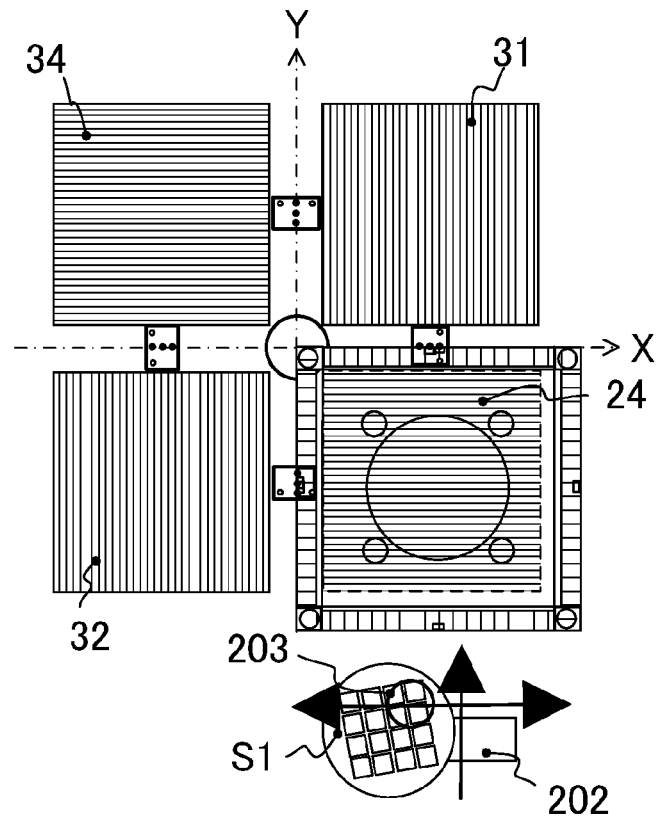
FIGS. 8A-8D are plane views for showing an import of a substrate to the fine movement movable member of the measurement unit shown in FIG. 1.
Figure 8B:
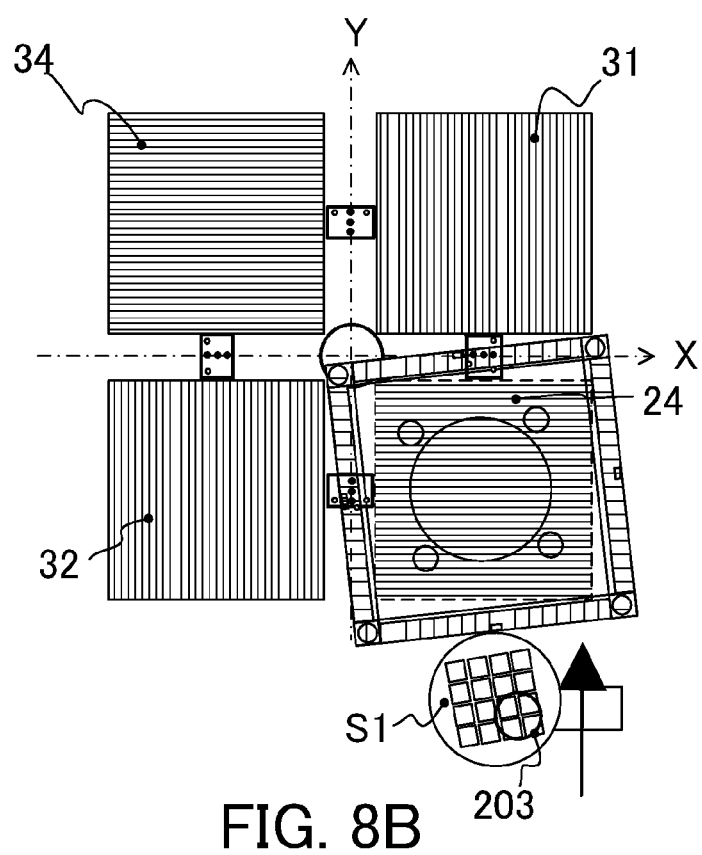
Figure 8C:
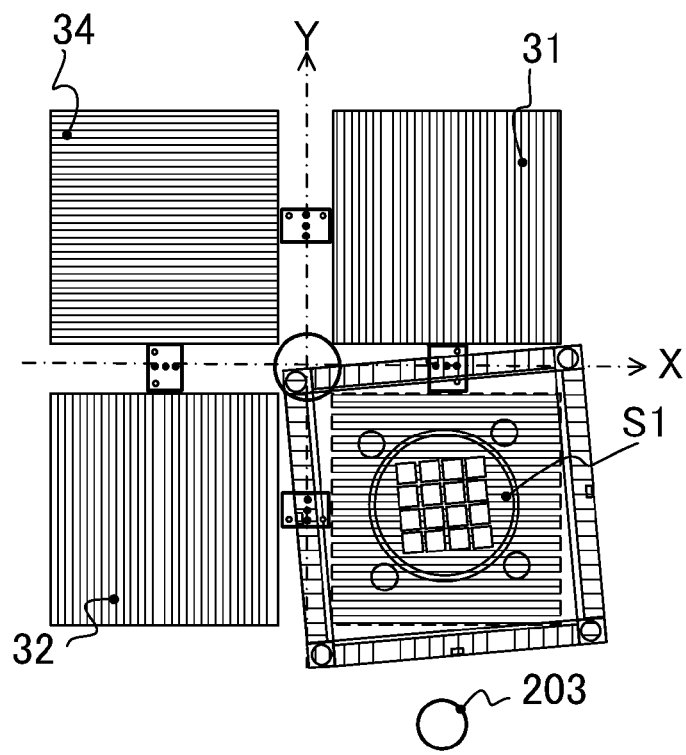
Figure 8D:
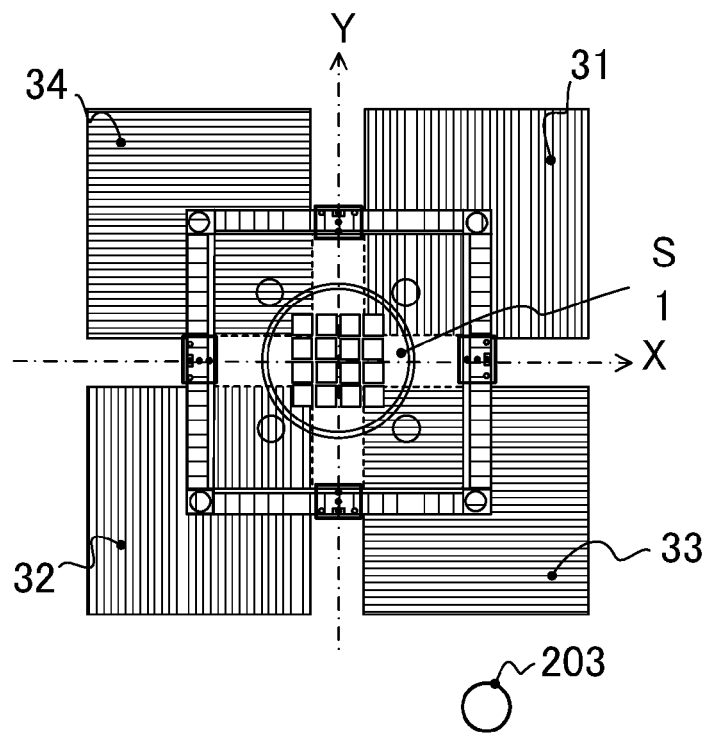

FIG. 8A is a plane view showing that an alignment mark (not shown) on the scribe line on the substrate are measured while the substrate is being carried by the transport hand 202. FIG. 8B is a plane view showing that another alignment mark is measured, the rotation component of the scribe line of the substrate is calculated from the measurement results of the two alignment marks, and the fine movement movable member 24 is rotated by the rotation component. FIG. 8C is a plane view showing that the substrate S1 is mounted on the fine movement movable member 24 that has been rotated. FIG. 8D is a plane view showing that after the substrate S1 is mounted on the fine movement movable member 24, the orientation of the fine movement movable member 24 is returned, and the fine movement movable member 24 is moved to the center of the measurement unit 21.

Thereby, a direction of the grating in the encoder head (such as one labeled with a reference numeral 82 shown in FIG. 6) can be accorded with a rotational direction (such as one labeled with a reference numeral 32 shown in FIG. 6) of the grating as a measurement object of the encoder head. If they are not accorded with each other, a phase difference of the interference pattern occurs, the interpolation error increases, and the measurement error occurs. This embodiment provides to the movable member side the X scales 45 and 46 and the Y scales 47 and 48 whose directions can be measured by the X detection head units 5, 6, 25, and 26 and the Y detection head units 7, 8, 27, and 28. Therefore, it is enough to align the orientation of the grating in the encoder head with the X scale and the Y scale, and the adjustment becomes easy and highly precise.

A description will now be given of an operation of an exposure apparatus of this embodiment.

Initially, the gratings are calibrated with high precision using a reference substrate (not shown) having a reference scale made of a low thermal expansion material. This embodiment measures the magnification, the rotation, and the height of each of all surfaces of the gratings 11-14 and 31-34, and all X and Y scales on the fine movement movable members 4 and 24 of the substrate stage, and prepares correction data using the reference substrate as a reference. This time-consuming calibration is executed only when the position detector is installed or the alignment precision becomes abnormal. The correction data is stored in a memory (not shown).

Next, this embodiment performs a regular grating calibration, in which a magnification, a rotation, and a height are measured in the measurement direction of the grating, as shown in FIG. 7. Based on this measurement result, the correction data of the measurement values of the magnification, the rotation, and the height is corrected at all positions of all gratings, which is determined by the highly precise grating calibration. This measurement is not performed for the entire surface of the grating, and is enough for the regular calibration because this measurement measures a vicinity of a center of each grating, as shown in FIG. 7. The calibration data is stored in a memory (not shown).

As described above, according to the exposure apparatus of this embodiment, the X detection head units 5, 6, 25, and 26 and the Y detection head units 7, 8, 27, and 28 measure the X scales 45 and 46 and the Y scales 47 and 48. Simultaneously, the X encoder heads 51 and 52 and the Y encoder heads 53 and 54 measure the gratings 11-14 and 31-34. A difference of the measurement value is stored as correction data of the grating, and then the correction data is used to correct the position in controlling the position of the substrate stage. Since the correction data of the gratings 11-14 and 31-34 can be quickly and regularly measured using the X scales 45 and 46 and the Y scales 47 and 48 as references, highly precise position detections and the positional control using the detection results can be maintained.

This embodiment provides the X detection head units 5, 6, 25, and 26, and the Y detection head units 7, 8, 27, and 28 as fixed members that are less likely to vibrate, and the X scales 45 and 46 and the Y scales 47 and 48 as movable members to the substrate stage side which reciprocates at a high acceleration. Therefore, the position detector of this embodiment is likely to secure long-term measurement reproducibility.

Next, the measurement unit 21 detects the origin. Initially, in accordance with the method shown in FIG. 8, the substrate S1 is mounted on the fine movement movable member 24 and moved to the center of the measurement unit 21. Here, the heights of the surfaces of the X scales 45 and 46 and the Y scales 47 and 48 are adjusted to specified heights using the gap sensors in the X detection head units 25 and 26 and the Y detection head units 27 and 28.

Thereafter, the positions of the X scales 45 and 46 are measured using the X detection head units 25 and 26. As a result of fine driving of the fine movement movable member 24 in the X-axis direction, the origin scales in the X scales 45 and 46 are detected by the origin detection heads in the X detection head units 25 and 26, the origin of the fine movement movable member 24 is detected in the X-axis direction, and its rotational direction is corrected.

Thereafter, the positions by the Y scales 47 and 48 are measured using the Y detection head units 27 and 28. As a result of fine driving of the fine movement movable member 24 in the Y-axis direction, the origin scales in the X scales 47 and 48 are detected by the origin detection heads in the Y detection head units 27 and 28, and the origin of the fine movement movable member 24 is detected in the Y-axis direction. Thereby, a position of the fine movement movable member 24 is precisely determined relative to the microscope 22.

After this operations, a controller (not shown) controls the positions of the fine movement movable member 24 by referring to the memory (not shown) and by calibrating data based on the measurement results of the gratings 31-34 conducted by the X encoder heads 51 and 52 and the Y encoder heads 53 and 54.

Next, the measurement unit 21 measures the reference mark. After the measurement unit 21 completes the origin detection, one of the original mark sensors 42 is moved to a position under the microscope 22. A stage reference mark (not shown) is arranged on the surface of the origin mark sensor 42, and the microscope 22 measures the position of this mark and more precisely determines the position of the fine movement movable member 24 relative to the microscope 22.

Next, the measurement unit 21 performs an alignment and measures a height. After the stage reference mark is measured, the microscope 22 measures the alignment mark of the substrate, S1 and then measures the height of the substrate. Thereby, position information and height information on the entire surface of the substrate are determined by using the stage reference mark as a reference.

Next, the exposure unit 1 detects the origin. After the alignment measurement and the height measurement by the measurement unit 21 are completed, the fine movement movable member 24 is moved to the exposure unit 1. Since the X encoder heads 51 and 52 and the Y encoder heads 53 and 54 shift from an area under the grating 31-34 in this movement, the positional control using the rough movement movable member 71 is used as shown in FIGS. 5B-5D.

After the fine movement movable member 24 is moved to the exposure unit 1, the precise position of the fine movement movable member 24 needs to be obtained relative to the barrel of the projection optical system 2. Therefore, the exposure unit 1 detects the origin similarly to the origin detection in the measurement unit 21. Since the X scales 45 and 46 and the Y scales 47 and 48 are used even in this case, the measurement result at the measurement unit 21 can be more quickly and more precisely reflected on the exposure unit 1.

After the origin detection ends, similar to the measurement unit 21, the position the fine movement movable member 24 is controlled based on the measurement results using the gratings 11-14 and the X encoder heads 51 and 52 and the Y encoder heads 53 and 54.

After the exposure unit 1 completes the origin detection, the exposure unit 1 measures the position of the original's image. One of the original mark sensors 42 is moved to a position under the projection optical system 2. A sensor configured to detect the XYZ position of the projected image of a specified original mark is arranged on the surface of the original mark sensor 42, and determines the position of the fine movement movable member 24 more precisely using the projected image of the original mark as a reference. Since a positional relationship between the sensor and the stage reference mark on the surface of the original mark sensor 42 is determined, the above operation provides position information and height information on the entire surface of the substrate by using the projected image of the original mark as a reference.

The exposure unit 1 starts exposure after the position of the image of the original is measured. Since a relationship between the position of the image of the original's pattern and the ideal positions in each of the XYZ directions and tilt directions of each shot on the substrate S1 is obtained, each shot is sequentially scanned for exposure.

A device, such as a semiconductor integrated circuit device and a liquid crystal display device, is manufactured by the step of exposing a photosensitive agent applied substrate (such as a wafer or a glass plate) using the above exposure apparatus, the step of developing the substrate, and other known steps (device manufacturing method).

When the microscope 22 has a very stable optical system and electric processing system, the position of the fine movement movable member 24 relative to the microscope 22 is precisely determined only by detecting the origin, and thus the measurement of the reference mark at the measurement unit 21 may be omitted. In addition, when the position of the original relative to the projection optical system 2 is very stable, the position of the fine movement movable member 24 is precisely determined relative to the barrel of the projection optical system 2 only by detecting the origin using the exposure unit 1 and thus the measurement of the original's image using the exposure unit 1 may be omitted.

The exposure apparatus of this embodiment needs an origin detection function having high reproducibility for the measurement unit 21 and the exposure unit 1. Hence, after the origin is detected, the measurement unit 21 measures the position of the origin mark sensor 42 using the microscope 22, and the exposure unit 1 measures, by using the original mark sensor 42, the projected image of the original mark that indicates a projected position of the original. In this configuration, however, the origin detecting position is distant from the subsequent measuring positions and thus the throughput may lower.

Figure 9:
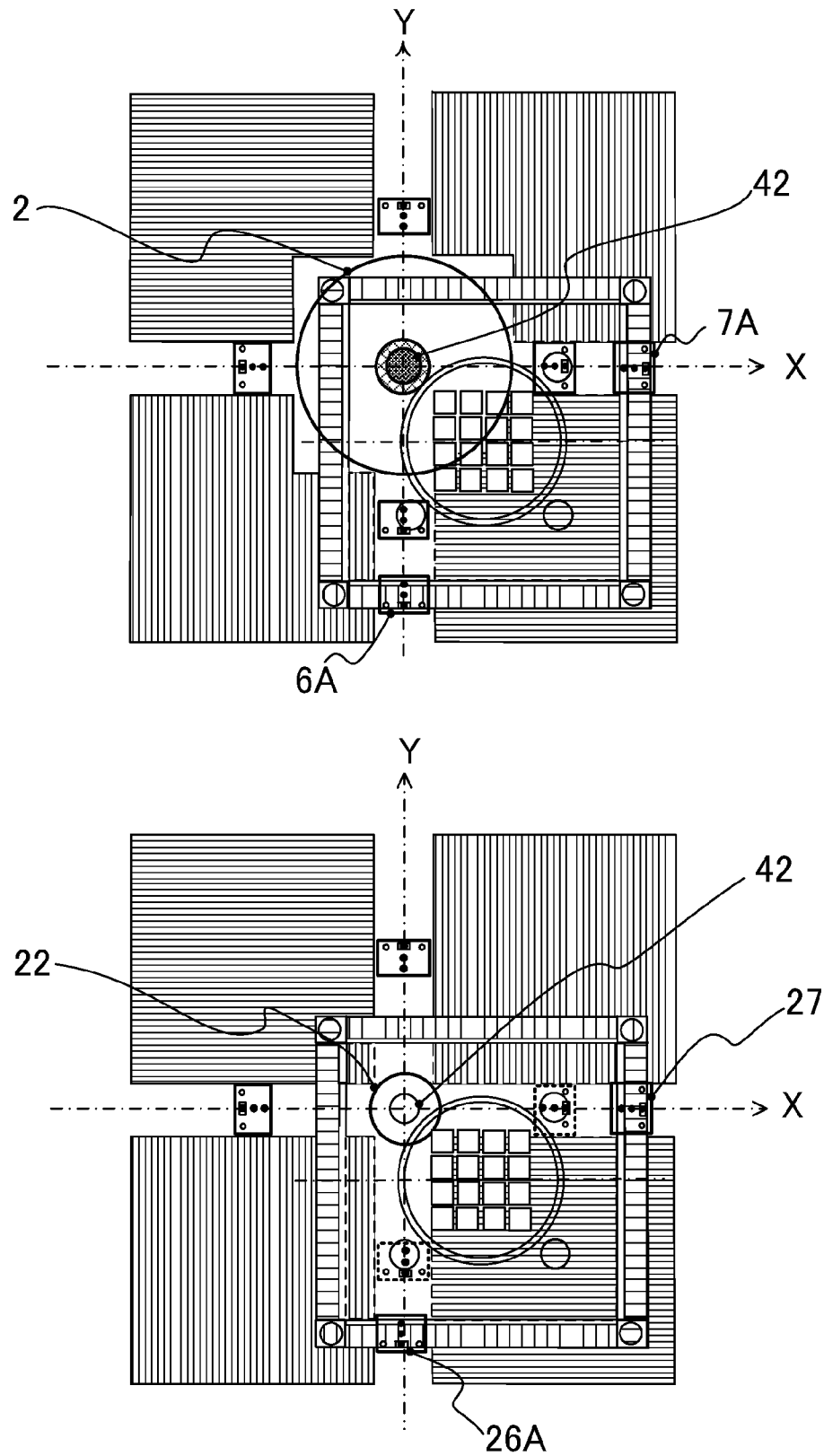
FIG. 9 is a transparent plane view of a structural variation of FIG. 1.

FIG. 9 is a transparent plane view of an embodiment that solves this problem. This embodiment provides the X detection head unit 6A and the Y detection head unit 7A near the X detection head unit 6 and the Y detection head unit 7 of the exposure unit 1. The X detection head unit 6A and the Y detection head unit 7A are positioned so that the X scale 46 and the Y scale 47 can be measured when the original mark sensor 42 of the upper left corner is moved to a position under the projection optical system 2. In addition, the X detection head unit 26A and the Y detection head unit 27A are provided near the X detection head unit 26 and the Y detection head unit 27 of the measurement unit 21. The X detection head unit 26A and the Y detection head unit 27A are positioned so that the X scale 46 and the Y scale 47 can be measured when the original mark sensor 42 of the upper left corner is moved to a position under the microscope 22. Of course, the positions of the X detection head unit and the Y detection head unit may be changed when the original mark sensor 42 different from that of the upper left corner is moved to a position under the projection optical system 2 or the microscope 22.

Thus, the second encoder head unit shown in FIG. 9 includes an encoder head arranged at a position at which the second grating unit can be measured, when the substrate stage is arranged at a position at which the reference mark of the substrate stage can be observed via the projection optical system 2 and the microscope 22. This structure enables the measurement unit 21 to immediately measure the position on the origin mark sensor 42 using the microscope 22 after the origin is detected, and the exposure unit 1 to immediately measure the position of the projected image of the original mark that indicates the projected position of the original.

This embodiment delivers the immersion area 3 between the two fine movement movable members. If the immersion area 2 is outside the position under the fine movement movable member 4A or 24A, the immersion area 3 cannot be held and consequently leaks out. A description will be given of a method for maintaining the measurement error by preventing the immersion area 3 from passing the tops of the Y scales of the fine movement movable members 4A and 24A.

Figure 10:
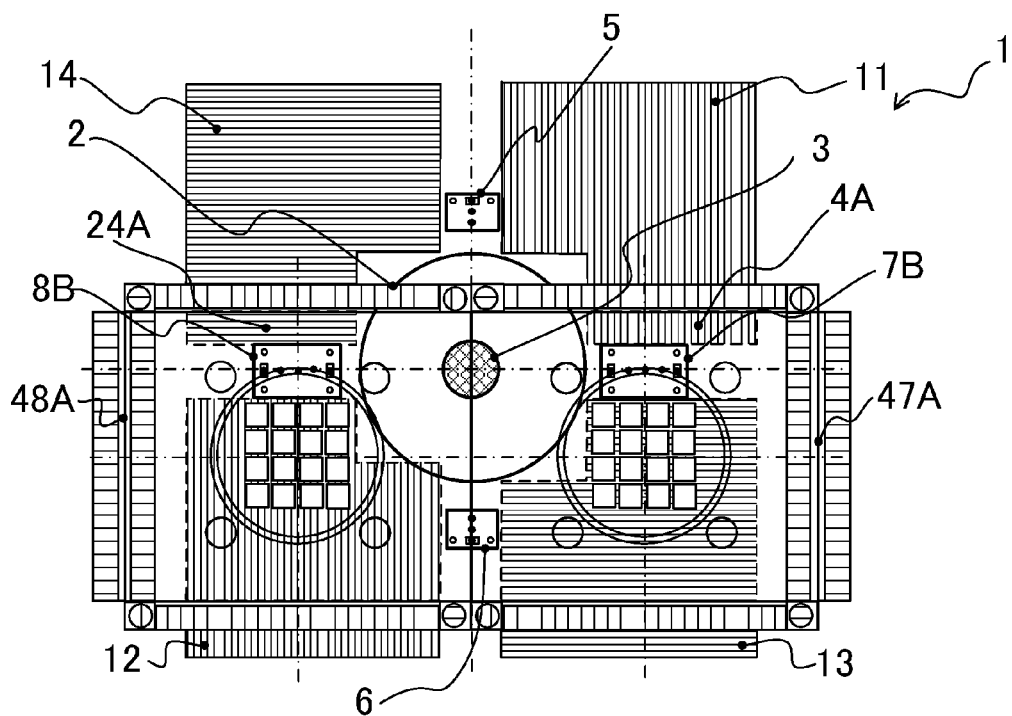
FIG. 10 is a transparent plane view of another structural variation of FIG. 1.
Figure 10:
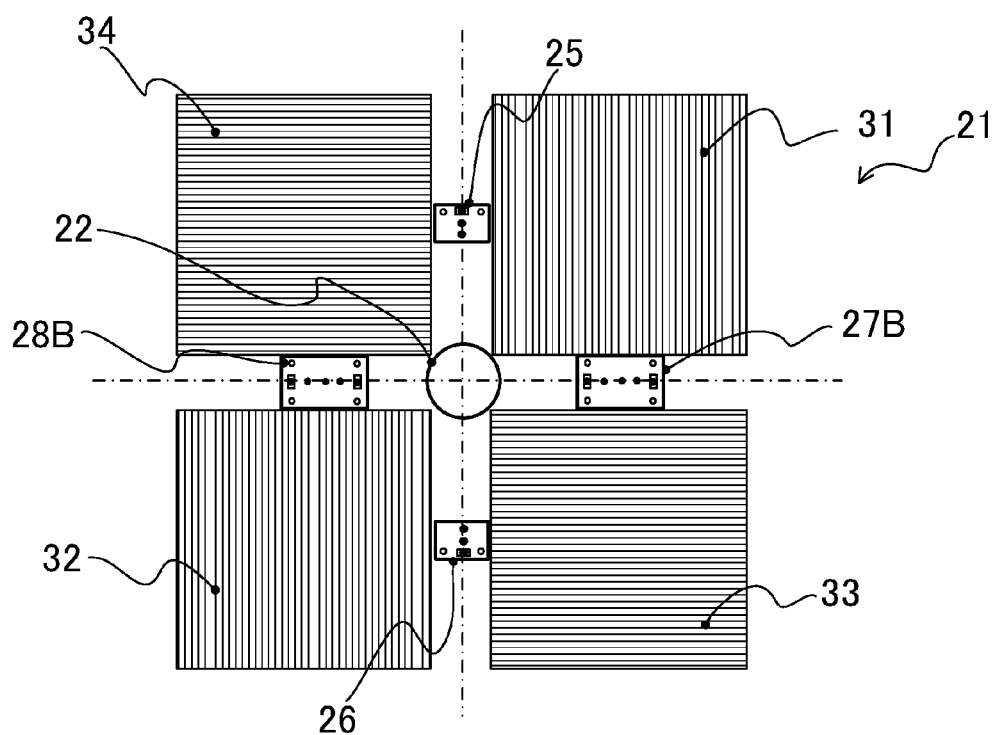
Figure 11:
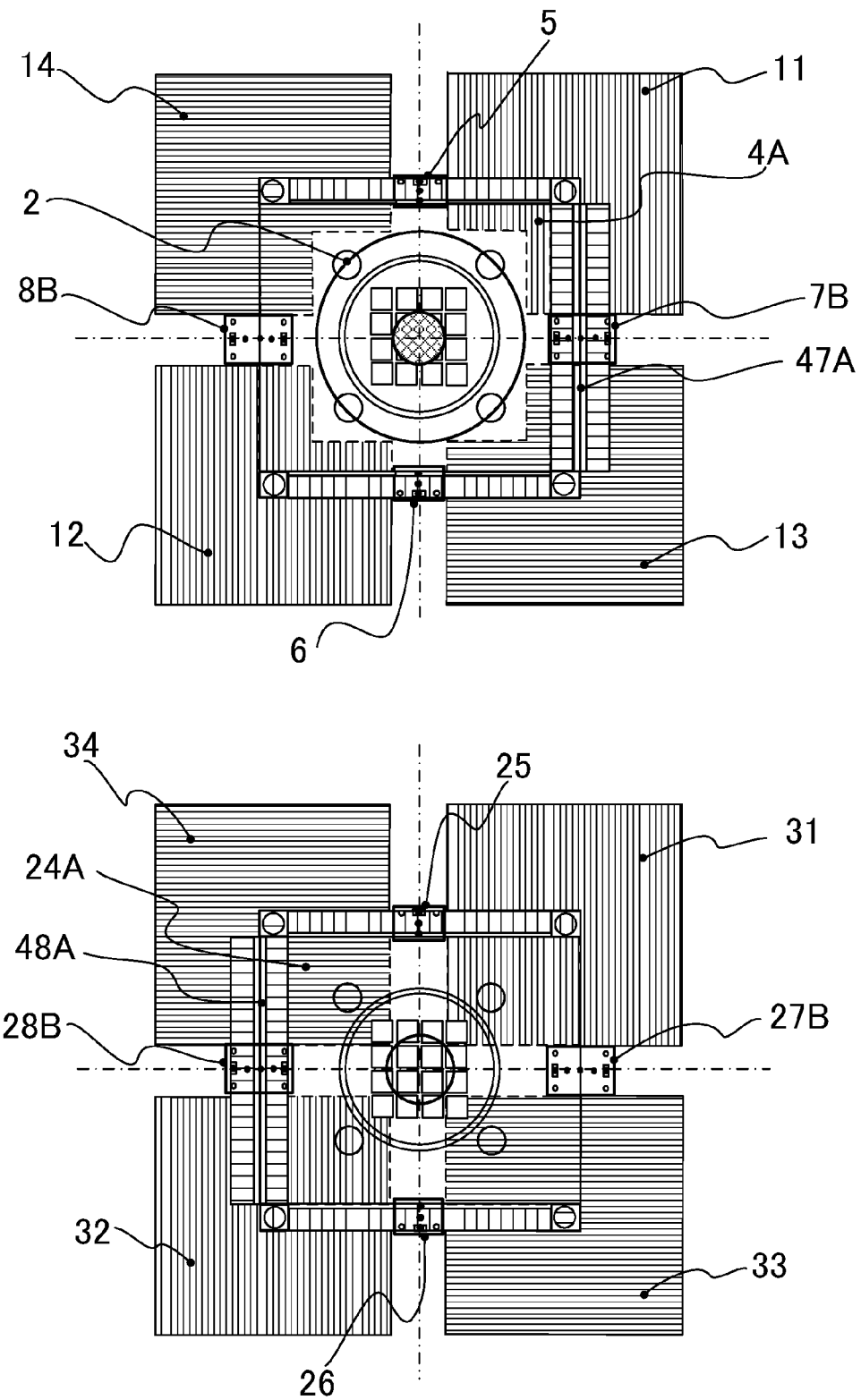
FIG. 11 is a transparent plane view showing another state of the structure of FIG. 10.

FIGS. 10 and 11 are transparent plane views showing one illustrative method of excluding the Y scale from a position between the fine movement movable members 4A and 24A (or a method of moving the Y scale to the outside of a channel of a movement of the substrate). FIG. 10 shows a delivery state of the immersion area 3, and FIG. 11 shows that the fine movement movable members 4A and 24A are located at the exposure unit 1 and the measurement unit 21, respectively.

The configuration shown in FIG. 10 attaches the Y scale 47A of the fine movement movable member 4A located at the right side to the right side of the fine movement movable member 4A, and the Y scale 48A of the fine movement movable member 24A arranged at the left side of the fine movement movable member 4A to the left side of the fine movement movable member 24A. The Y scales 47A and 48A are wider than the Y scales 47 and 48, and the Y detection head units 7B, 8B, 27B, and 28B also become wider correspondingly.

Figure 12:
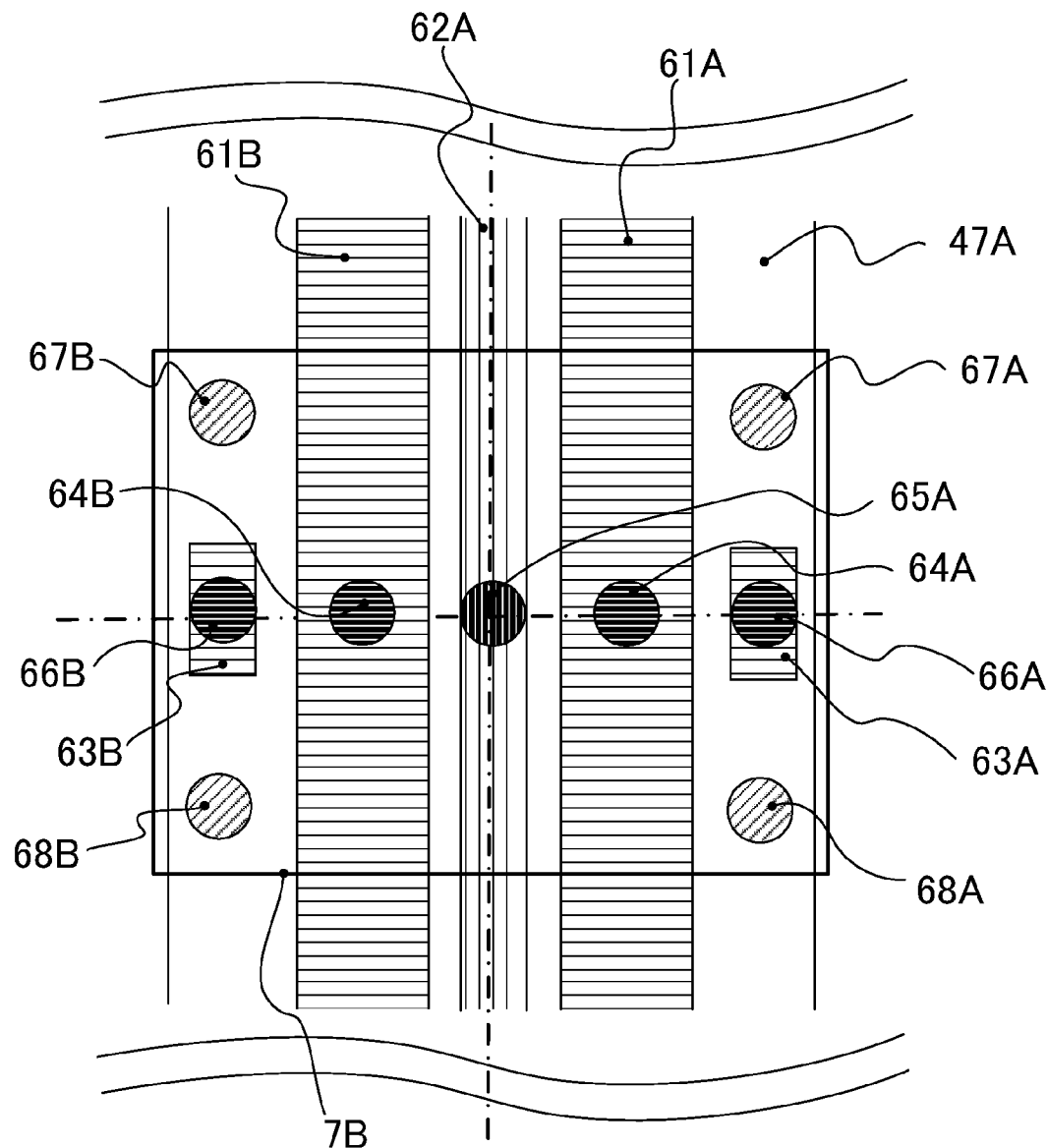
FIG. 12 is a partially enlarged transparent plane view of FIG. 10.

FIG. 12 is a partially enlarged transparent plane view showing details of the Y detection head unit 7B and the Y scale 47A. The Y detection head unit 7B includes Y encoder heads 64A, 64B, X encoder heads 65A, origin detection heads 66A and 66B, and gap sensors 67A, 67B, 68A, and 68B. On the other hand, the Y scale 47A is provided with Y scale member 61A and 61B, X scale member 62A, and origin scales 63A and 63B. The Y detection head units 8B, 27B, 28B, and the Y scale 48A have similar structures.

Figure 13:
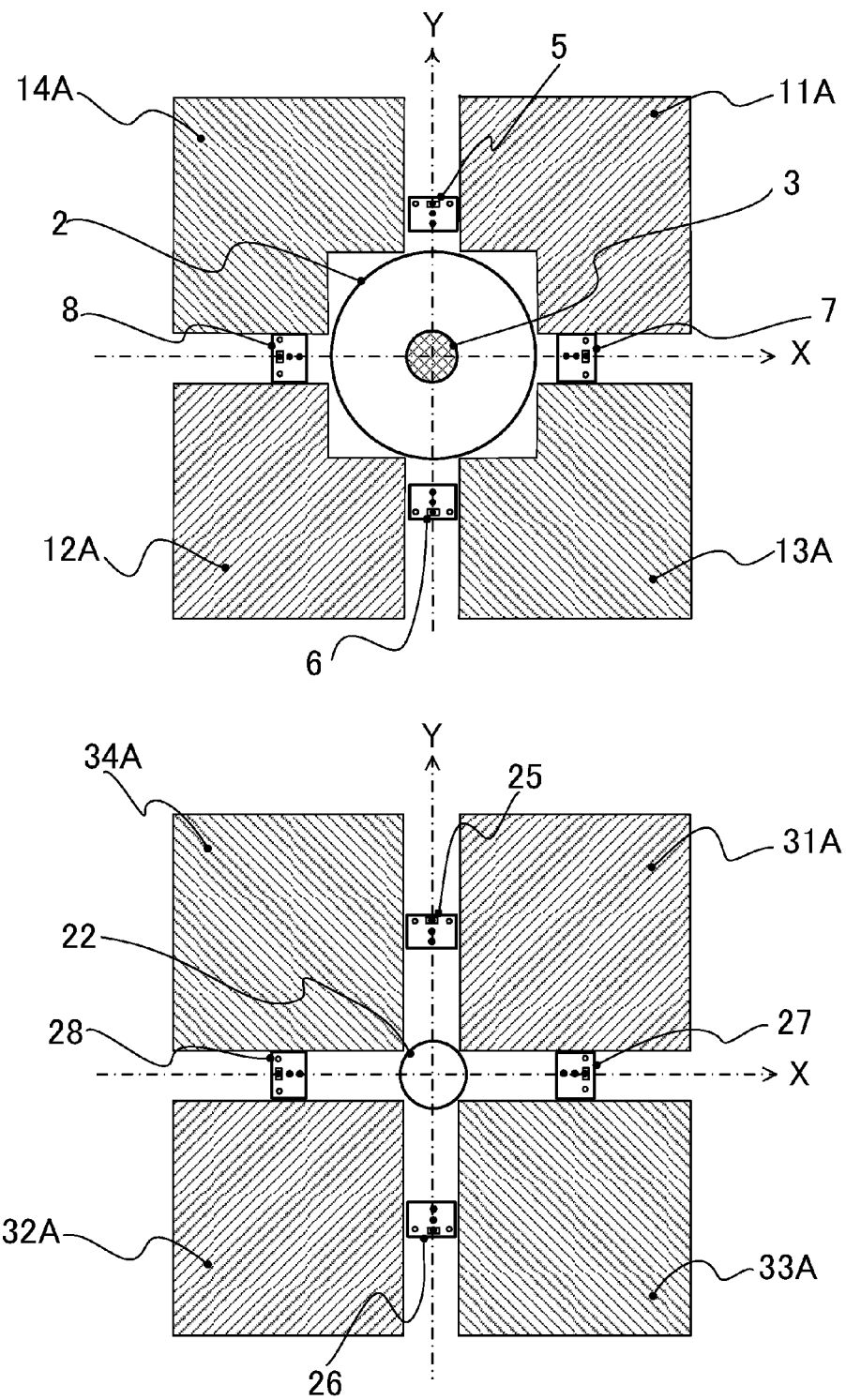
FIG. 13 is a plane view showing a variation of the grating of FIG. 3.

FIG. 13 is a plane view showing a variation of the gratings 11-14 and 31-34 shown in FIG. 3. The gratings 11A and 12A are diagonally arranged with respect to the optical axis of the projection optical system 2, while their grating surfaces face down. These grating surfaces have patterns that extend in a +45° direction (X=Y direction). The gratings 13A and 14A are diagonally arranged with respect to the optical axis of the projection optical system 2, while their grating surfaces face down. These grating surfaces have patterns that extend in a −45° direction (−X=Y direction). The gratings 31A-34A have structures corresponding to the gratings 11A-14A. In other words, in FIG. 13, the gratings 11A-14A and 31A-34A as the first grating unit have patterns that extend in the +45° direction or the −45° direction relative to both the two directions (XY directions).

Referring to FIG. 13, gratings (not shown) in the X encoder heads 51 and 52 and gratings in the Y encoder heads 53 and 54 have patterns that extend in directions parallel to those of the gratings 11A-14A and 31A-34A (or +45° direction or −45° direction). The X-axis direction and the Y-axis direction are measured from the measurement results of one or two encoder heads in FIG. 3, whereas the X-axis direction and the Y-axis direction are obtained from the measurement results of three or four encoder heads in FIG. 13. Therefore, the averaging effect improves the measurement reproducibility.

Figure 14:
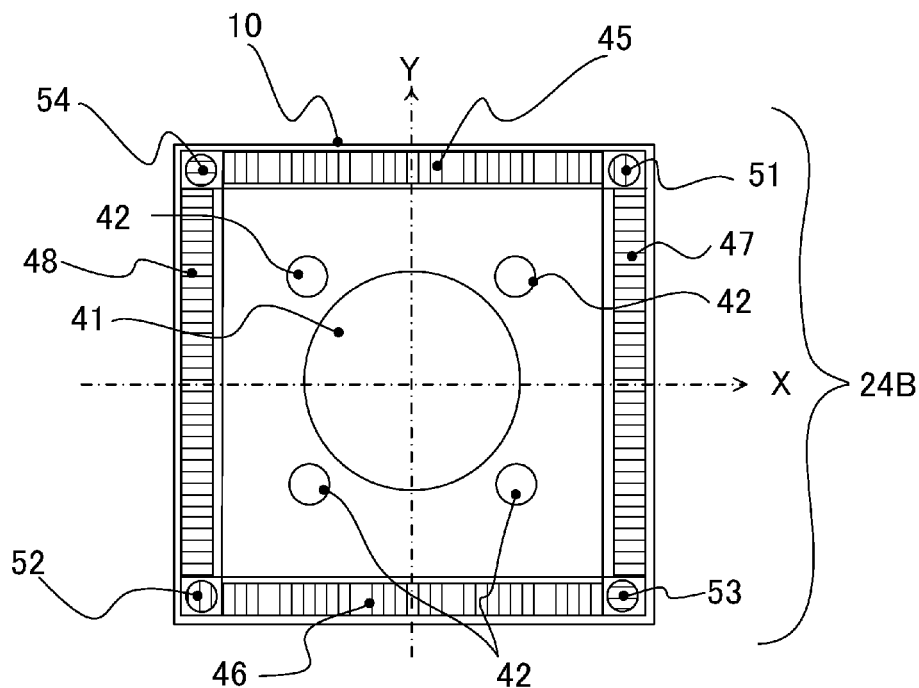
FIG. 14 is a transparent plane view showing a variation of FIG. 2.

FIG. 14 is a transparent plane view showing a variation of FIG. 2. Although a fine movement movable member 24B is provided with a movable member of a position detector, a stage top plate 10 is attached to the fine movement movable member 24B differently from FIG. 2. This embodiment provides the stage top plate 10 used to house all components of the position detector other than the substrate chuck 41, such as the first encoder head unit and the second grating unit, in the fine movement movable member 24B. Thus, positional adjustments are unnecessary between the gratings in a plurality of encoder heads and a plurality of scales, and the structure is long-term stable and improves the measurement reproducibility.

Figure 15:
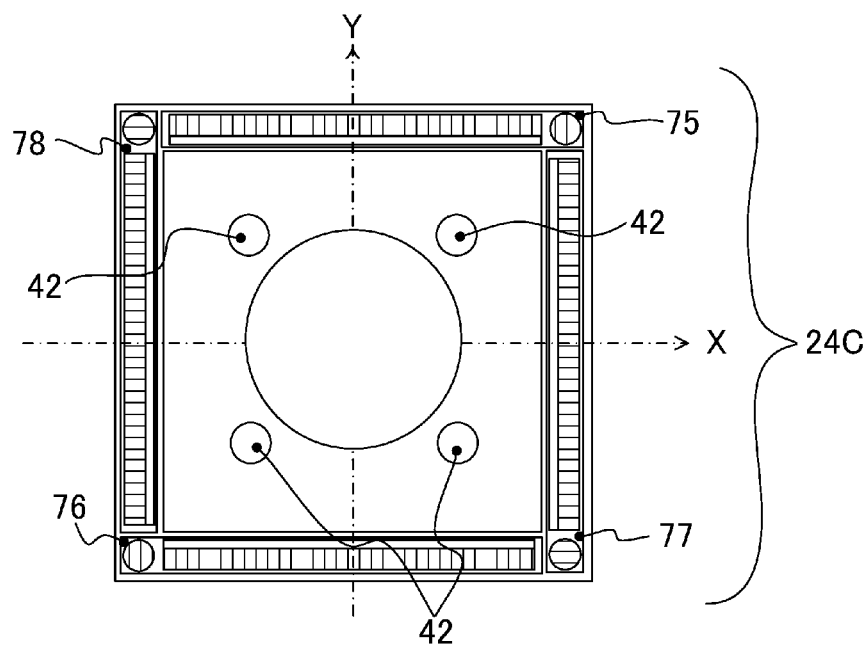
FIG. 15 is a transparent plane view showing another variation of FIG. 2.

FIG. 15 is a transparent plane view showing another variation of FIG. 2. A fine movement movable member 24C is provided with a movable member of the position detector, but the encoder head is integrated with the scale, differently from FIG. 2. In other words, the movable member of the position detector shown in FIG. 15 includes the X encoder scales 75 and 76 in which the grating of the X encoder head is integrated with the X scale, and the Y encoder scales 77 and 78 in which the grating of the Y encoder head is integrated with the Y scale. Since this embodiment integrates the grating in the encoder head with the scale, the position adjustment becomes easier and the small integrated component can be comparatively easily and inexpensively manufactured.

An application object of the position detector according to the present invention is not limited to the substrate stage of the exposure apparatus.

The position detector is applicable to an application of a position detection of a substrate stage in an exposure apparatus. The exposure apparatus is applicable to a device manufacture application.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-048819, filed Mar. 3, 2009, which is hereby incorporated by reference herein in its entirety.

What is claimed is:

1. A position detector comprising:
a first planar encoder including a first encoder head unit mounted on a test object that is a movable member, and a first grating unit mounted on a fixed member, the first planar encoder being configured to detect a position of the test object in two directions by measuring a position of the first grating unit using the first encoder head unit; and
a second planar encoder including a second encoder head unit mounted on the fixed member, and a second grating unit mounted on the movable member, the second planar encoder being used to generate data for calibrating the position of the first grating unit measured by the first encoder head unit.

2. The position detector according to claim 1, wherein the second planar encoder generates the data as a result of that the first encoder head unit measures the first grating unit by driving the test object in one of the two directions while a height and an inclination of the second grating unit are maintained in a direction orthogonal to the two directions.

3. The position detector according to claim 1, wherein the second grating unit includes a pair of scale members corresponding to the two directions, and an origin scale,
wherein the second encoder head unit includes a pair of encoder heads configured to detect the pair of scale members, and an origin detection head configured to detect the origin scale, and
wherein the pair of encoder heads and the origin detection head detect an origin.

4. The position detector according to claim 1, wherein the two directions are orthogonal to each other, and the first grating unit has a pattern that extends in a +45° or −45° direction relative to both of the two directions.

5. The position detector according to claim 1, further comprising a top plate configured to house the first encoder head unit and the second grating unit in the test object.

6. The position detector according to claim 1, wherein in one of the two directions, a grating of the second grating unit is integrated with a grating of the first encoder head unit.

7. An exposure apparatus comprising a position detector that includes:
a first planar encoder including a first encoder head unit mounted on a test object that is a movable member, and a first grating unit mounted on a fixed member, the first planar encoder being configured to detect a position of the test object in two directions by measuring a position of the first grating unit using the first encoder head unit; and
a second planar encoder including a second encoder head unit mounted on the fixed member, and a second grating unit mounted on the movable member, the second planar encoder being used to generate data for calibrating the position of the first grating unit measured by the first encoder head unit.

8. The exposure apparatus according to claim 7, wherein the position detector includes a first position detector and a second position detector, wherein the exposure apparatus further comprises:

an exposure unit that includes a first substrate stage configured to support and drive a substrate, the first position detector configured to detect a position of the first substrate stage, and a projection optical system configured to project a pattern of an original onto the substrate, the exposure unit being configured to expose the substrate via a liquid that is filled in a space between the projection optical system and the substrate; and a measurement unit configured to obtain alignment information and focus information of the substrate, the measurement unit including a second substrate stage configured to support and drive the substrate, and the second position detector configured to detect a position of the second substrate stage, and wherein the second grating unit of the first position detector and the second grating unit of the second position detector are arranged outside of a channel in which the substrate measured by the measurement unit is moved from the second substrate stage to the first substrate stage.

9. The exposure apparatus according to claim 7, further comprising a substrate stage configured to support and drive a substrate, wherein the position detector detects a position of the substrate stage, and wherein the second encoder head unit includes an encoder head arranged at a position such that the encoder head can measure the second grating unit when the substrate stage is arranged at a position used to observe a reference mark of the substrate stage via a projection optical system.

10. A device manufacturing method comprising the steps of:

exposing a substrate using an exposure apparatus including a position detector; and developing the substrate that has been exposed, wherein the position detector includes:

a first planar encoder including a first encoder head unit mounted on a test object that is a movable member, and a first grating unit mounted on a fixed member, the first planar encoder being configured to detect a position of the test object in two directions by measuring a position of the first grating unit using the first encoder head unit; and a second planar encoder including a second encoder head unit mounted on the fixed member, and a second grating unit mounted on the movable member, the second planar encoder being used to generate data for calibrating the position of the first grating unit measured by the first encoder head unit.

* * * * *